United States Patent
Tanabe et al.

(10) Patent No.: US 7,116,947 B2
(45) Date of Patent: Oct. 3, 2006

(54) TRANSMITTER

(75) Inventors: Mitsuru Tanabe, Katano (JP); Taiji Akizuki, Sendai (JP); Koichiro Tanaka, Takarazuka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 42 days.

(21) Appl. No.: 11/085,459

(22) Filed: Mar. 22, 2005

(65) Prior Publication Data

US 2005/0215209 A1    Sep. 29, 2005

(30) Foreign Application Priority Data

Mar. 23, 2004   (JP) .............................. 2004-085026

(51) Int. Cl.
H04B 1/02 (2006.01)
H04B 1/04 (2006.01)
H01Q 11/12 (2006.01)

(52) U.S. Cl. ..................................... 455/91; 455/127.1
(58) Field of Classification Search .................. 455/91, 455/127.15, 71, 73, 108, 116, 110; 330/270, 330/11, 290, 297; 375/146, 330, 297, 295
See application file for complete search history.

(56) References Cited

U.S. PATENT DOCUMENTS

| 6,256,482 | B1 | 7/2001 | Raab |
| 2004/0185803 | A1* | 9/2004 | Tanabe et al. .............. 455/108 |
| 2005/0118965 | A1* | 6/2005 | Tanabe et al. ............ 455/127.1 |
| 2005/0136854 | A1* | 6/2005 | Akizuki et al. .............. 455/91 |
| 2005/0202789 | A1* | 9/2005 | Tanabe et al. .............. 455/110 |
| 2006/0068697 | A1* | 3/2006 | Tanabe et al. ................ 455/1 |

* cited by examiner

Primary Examiner—Aung Moe
(74) Attorney, Agent, or Firm—Stevens, Davis, Miller & Mosher, LLP

(57) ABSTRACT

An amplitude component and a phase component of a modulated signal are inputted into a power supply terminal and an input terminal of an RF power amplifier, respectively, and a modulated wave that is produced by demodulating an original modulated signal is obtained from the RF power amplifier. A supply voltage is supplied to an emitter follower and an operational amplifier via a switch group from a DC-DC converter group whose output voltages are sequentially different. As the supply voltage, any pair of outputs of DC-DC converters by the switch group is selected according to levels of the amplitude component, and provides them to the emitter follower and the operational amplifier. The emitter follower performs a DC conversion of the provided supply voltage to provide it to the RF power amplifier.

4 Claims, 5 Drawing Sheets

TRANSMITTER

BACKGROUND OF THE INVENTION

1. Field of the Invention

The present invention relates to a radio transmitter being used for a communication mode which uses a multicarrier signal, such as OFDM (Orthogonal Frequency Division Multiplex) scheme.

2. Description of the Prior Art

Generally, to process a signal modulated with an amplitude modulation scheme, especially a signal modulated with a multi-level modulation scheme, such as a quadrature amplitude modulation (hereinafter, referred also to as QAM) scheme, a linear amplification is required to an RF power amplifier for transmitting power to an antenna. For that reason, class A or class AB has been adopted as an operation class of the RF power amplifier.

However, with the progress of broadband communications, a communication mode using a multicarrier signal, such as an Orthogonal Frequency Division Multiplex (hereinafter, referred also to as OFDM) scheme has come to be used. However, when using a conventional class A or class AB RF power amplifier in such a communication mode, an improvement in efficiency may not be expected. In other words, in the OFDM scheme, a large amount of power is instantaneously generated completely at random due to a superposition of subcarriers. That is, it means that a ratio between an average power and an instantaneous peak power, i.e., a Peak to Average Power Ratio (hereinafter, referred also to as PAPR) is large. For this reason, a large amount of DC power needs to be always maintained so as to also amplify the instantaneous peak power linearly, which is much greater than the average power. In class A operation, power efficiency is only 50% at the maximum, and particularly in the OFDM scheme, since PAPR is high, the power efficiency will be dropped to about 10%.

Meanwhile, when a saturated type amplifier can be used, a period while a drain current and a drain voltage are simultaneously generated is reduced as short as possible, thereby making it possible to suppress power consumption. The saturated type amplifier includes a class F amplifier in which a higher harmonic is controlled so that a drain voltage waveform may be a rectangular wave, or a class E amplifier or a class D amplifier in which a load condition is optimized so that a drain voltage waveform and a drain current waveform may not be overlapped.

For example, supposing that a DC power with a current of 200 mA and Vdd of 3 V is supplied, the amount of the DC power will be 600 mW. In the saturated type amplifier composed of a transistor, the current does not flow when the transistor is in OFF-state, but only the voltage Vdd is applied, resulting in zero DC power consumption. Meanwhile, when the transistor is in ON-state, the current of 200 mA will flow, but the transistor is completely conducted, so that it is assumed that a drain-source voltage VDS may be about 0.3 V at the maximum, which is a saturation voltage. In this case, it means that the amount of the DC power of $0.3 \times 0.2 = 0.06$, i.e., 60 mW is consumed in the transistor. The power efficiency reaches as high as $(600-60)/600 = 90\%$. Since power efficiency of the class A amplifier reaches 50% at the maximum, this effect is significant.

That is, the saturated type amplifier will allow a high power efficiency. However, since the saturated type amplifier is a nonlinear amplifier, it can not be used for a signal whose amplitude level of a modulated wave changes like a QAM signal because of a remarkable deterioration of a modulation accuracy.

An Envelope Elimination and Restoration (hereinafter, referred also to as EER) method that is known as Kahn Technique has been proposed to solve such a problem (for example, refer to patent document 1).

FIG. 5 is a block diagram showing an outline of the EER method. In a transmitter shown in FIG. 5, a signal which is generated by a modulated signal generating means 50, for example, a QAM signal, is separated into a phase component and an amplitude component by an amplitude phase separating means 51. The phase component is inputted into an quadrature modulator 52 as an quadrature signal, frequency-converted by it, and outputted to a saturated type amplifier 53. Meanwhile, the amplitude component is amplified to a desired amplitude level by an operational amplifier 55, and inputted into a DC converter 54. The DC converter 54 outputs a current required by the saturated type amplifier 53 to the saturated type amplifier 53 with the amplitude component. In the saturated type amplifier 53, the phase component inputted as an RF, and the amplitude component inputted from a power supply are multiplied to restore a QAM modulated wave.

By taking such a configuration, a highly efficient amplifier such as the saturated type amplifier can be employed although it may be non-linear, thereby making it possible achieve an improvement in efficiency.

Patent document 1: U.S. Pat. No. 6,256,482B1 (page 3 of the drawings, FIG. 6)

Generally, when the modulated signal is separated into the amplitude component and the phase component, a band thereof is spread about 5 times. For example, in the case of an OFDM signal of an IEEE802.11a standard which is a standard for wireless LAN, since a signal band of a baseband is approximately 8 MHz, it will be spread to a band of 40 MHz. However, a band of the DC converter 54, for example a switching regulator, which modulates the amplitude component, is at most 1 MHz, so that the EER method of such a signal can not be achieved by using the conventional configuration.

In order to spread the band, it is necessary to improve the speed of a switching element of the DC converter (switching regulator) 54. Whereas, since an improvement in speed of the switching element will lead to a decrease in withstand voltage thereof, it is thought that a further improvement in speed beyond this may not be made.

In addition, when a series regulator is used as the DC converter 54, a product of the amount of DC conversion (difference between a supply voltage and an amplitude component voltage) and a drain current of the RF power amplifier will be given as the power consumption. In the OFDM scheme, since an average voltage of the amplitude component is equal to or less than one half of the supply voltage, the improvement in efficiency can not be expected in this case, either.

Further, in order to amplify the amplitude component without distortion also in the operational amplifier 55, the supply voltage equal to or more than a peak amplitude component needs to be maintained, so that the OFDM scheme that has a large difference between the peak voltage and the average voltage will causes a reduction in power efficiency.

SUMMARY OF THE INVENTION

An object of the present invention is to provide a transmitter that can achieve a broadband EER method, without reducing efficiency.

In order to solve a problem described above, a transmitter according to a first aspect of the first invention includes a modulated signal generating means that generates a modulated signal, an amplitude slicing means that slices an amplitude component of the modulated signal at a plurality of voltage levels which are stepwisely different, a first and a second plurality of switching regulators that convert a supply voltage into a plurality of voltages whose values are stepwisely different, a first switch group that selects any one of output voltages of the first plurality of switching regulators, a second switch group that selects any one of output voltages of the second plurality of switching regulators, a switch driver that selectively makes a conduction of each of switches of the first and the second switch group according to slice data of the amplitude component sliced by the amplitude slicing means, an amplitude amplifying means that amplifies the amplitude component using an output voltage of either of the switching regulators selected by the first switch group as a supply voltage, a linear DC converting means that performs a DC-conversion of an output from the amplitude amplifying means using an output voltage of either of the switching regulators selected by the second switch group as a supply voltage, and an RF power amplifier that receives the modulated signal or its phase component to an RF input terminal, receives an amplitude component to which the DC-conversion is performed by the linear DC converting means to a power supply terminal, and eventually outputs a modulated wave whose amplitude component and phase component are multiplied.

According to this configuration, there is provided the first and the second plurality of switching regulators that convert the supply voltage into the plurality of voltages whose values are stepwisely different, any one of the output voltages of the first plurality of switching regulators is selected by the first switch group according to levels of the amplitude component, and the amplitude amplifying means uses the output voltage of the selected switching regulator as the supply voltage. In addition, any one of the output voltages of the second plurality of switching regulators is selected by the second switch group according to the levels of the amplitude component, and the linear DC converting means performs the DC conversion of the amplitude component using the output voltage of the selected switching regulator as the supply voltage. Therefore, a voltage drop due to the linear DC converting means can be suppressed to be low, and a power loss due to the linear DC converting means can be suppressed. Moreover, since the amplitude amplifying means can also be driven with the minimum voltage in order to linearly amplify the amplitude component, power consumption can be suppressed to be low. Accordingly, a consumed electric current of a circuit block which performs analog operation of the amplitude component can be suppressed to be low. In addition, the linear DC converting means is used for the DC conversion, thereby making it possible to achieve broadband. Accordingly, a broadband EER method can be achieved, without reducing the efficiency.

Further, when not the phase component but the modulated signal is used as it is, it is possible to avoid a deterioration of a modulation accuracy (Error Vector Magnitude: EVM), which can not be avoided in the EER method that separates the signal into the amplitude component and the phase component and extracts them. In other words, when using the phase component, the phase component is filtered within the range that a band of an digital-to-analog converter allows, and to the extent of not affecting the EVM. At this time, a partial level drop of the phase component caused by the filtering has caused a remarkable deterioration of the EVM, when the phase component has been composed with the amplitude component at an output of the RF power amplifier. In addition, since as compared with the phase component separated from the modulated signal, a necessary bandwidth of the modulated signal is smaller by about ⅙, a bandwidth of a digital-to-analog converter and a bandwidth of an anti-aliasing filter which suppresses a spurious component produced by digital-to-analog conversion can be narrowed. Therefore, it is advantageous to achieve a reduction in power consumption of the digital-to-analog converter, and a miniaturization and a reduction in cost of the an inductor being used for the filter.

Further, according to this configuration, when the amplitude component provided to the RF power amplifier is 0, power inputted into the RF power amplifier is also 0, so that a correct modulated wave can be formed at the output of the RF power amplifier without depending on an isolation characteristic.

In the configuration described above, it further includes following configuration, for example. The first switch group is provided between output terminals of the first plurality of switching regulators and a power supply terminal of the amplitude amplifying means. The second switch group is provided between output terminals of the second plurality of switching regulators and a power supply terminal of the linear DC converting means.

Meanwhile, in the configuration described above, following configuration may also be employed. The first switch group is arranged between output terminals of the first plurality of switching regulators and a power supply terminal of the amplitude amplifying means. In addition, the plurality of linear DC converting means are arranged corresponding to the second plurality of switching regulators, respectively, the output terminals of the second plurality of switching regulators are individually connected to power supply terminals of the plurality of linear DC converting means, respectively, and the output terminals of the plurality of linear DC converting means are connected to a power supply terminal of the RF power amplifier in common. Further, the second switch group is arranged between an output terminal of the amplitude amplifying means and input terminals of the plurality of linear DC converting means.

According to this configuration, there is provided the first and the second plurality of switching regulators that convert the supply voltage into the plurality of voltages whose values are stepwisely different, the plurality of linear DC converting means perform the DC conversion of the amplitude component, respectively, using the output voltage of the second plurality of switching regulators as the supply voltage, and any one of the plurality of linear DC converting means is made selectively effective according to the levels of the amplitude component. Therefore, a voltage drop by the linear DC converting means when performing the DC conversion can be suppressed to be low, and the power loss by the linear DC converting means can also be suppressed to be low. Further, since any one of the output voltages of the first plurality of switching regulators is also selected according to the levels of the amplitude component for the amplitude amplifying means, it can be driven with the minimum voltage in order to linearly amplify the amplitude component. Therefore, the power consumption can be suppressed to be low. In addition, the linear DC converting means is used for the DC conversion, thereby making it possible to achieve broadband. Accordingly, the broadband EER method can be achieved, without reducing the efficiency. In addition, since the linear DC converting means is only provided between the switching regulator and the RF power amplifier, and the second switching means is removed from the path, the power loss can further be reduced.

In the transmitter of the present invention described above, a frequency converting means may be included in a preceding stage of the RF power amplifier.

According to this configuration, following function and effect may be provided. Since the band of the phase amplitude separating means is hundreds of MHz at most, when a carrier exceeds GHz, the transmitter can not deal with this frequency, but by using, for example an quadrature modulator which is the frequency converting means, a carrier frequency can easily be up-converted.

As explained in detail in the above, according to the present invention, in the EER method which allows the RF power amplifier to operate as the saturated type amplifier, a broadband and highly efficient operation can be achieved.

DETAILED DESCRIPTION OF THE PREFERRED EMBODIMENTS

Figure 1:
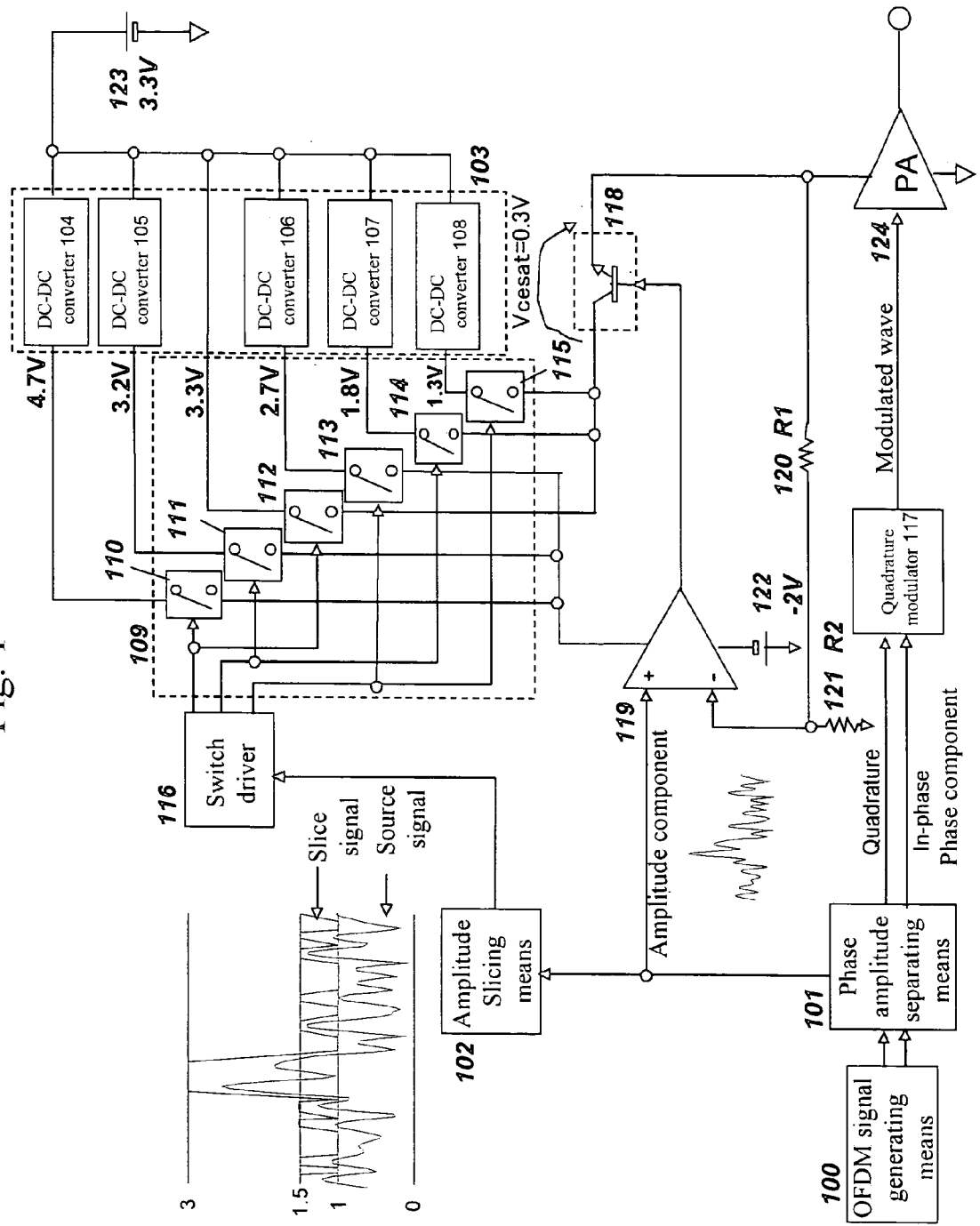
FIG. 1 is a block diagram showing a configuration of a transmitter according to a first embodiment of the present invention.

Hereafter, referring to the drawings, embodiments of the present invention will be explained.

(First Embodiment)

Hereafter, a first embodiment of the present invention will be explained with reference to the drawing. In this embodiment, a wireless LAN system according to IEEE802.11a standard which uses a broadband modulated signal will be explained as an example.

FIG. 1 shows a circuit diagram of a transmitter according to the first embodiment of the present invention which achieves an EER method. As shown in FIG. 1, this transmitter includes an OFDM signal generating means 100, a phase amplitude separating means 101, an amplitude slicing means 102, a switching regulator group 103, a switch group 109, a switch driver 116, an quadrature modulator 117, an emitter follower 118, an operational amplifier 119, a resistor 120 with a resistance R1, a resistor 121 with a resistance R2, a negative power supply 122 with a negative voltage of −2 V, a positive power supply 123 with a positive voltage of 3.3V, and a saturated type RF power amplifier 124.

The above OFDM signal generating means 100 generates an OFDM signal, and corresponds to a modulated signal generating means that generates a modulated signal.

The phase amplitude separating means 101 separates into a phase component and an amplitude component the OFDM signal generated by the OFDM signal generating means 100.

The amplitude slicing means 102 slices the amplitude component separated by the phase amplitude separating means 101 at a plurality of suitable voltage levels which are stepwisely different. In this embodiment, for example, 1.0 V, 1.5 V, and 3 V as a conversion of an emitter terminal output of the emitter follower 118 are set as these voltage levels. It is shown in FIG. 1 the amplitude component, i.e., a source signal, which is inputted into the amplitude slicing means 102, and an output signal of the amplitude slicing means 102, i.e., a slice signal.

Here, a relationship between the source signal and the slice signal shown in FIG. 1 will be explained. The amplitude slicing means 102 detects a voltage level of the amplitude component as shown in FIG. 1, compares the voltage level with a predetermined voltage level, and slices the amplitude component according to a comparison result.

An amplitude slicing method is performed in such a way that the voltage level is rounded up to the maximum value of a range included, for example, when 0V<amplitude component≦1.0 V, the amplitude component is rounded up to 1 V, and when 1 V<amplitude component≦1.5 V, it is rounded up to 1.5 V. In FIG. 1, since there are three levels in total, these are allocated to 2-bit data 01, 10, and 11. As a result, 2-bit slice data is outputted to the switch driver 116.

The switching regulator group 103 is composed of a plurality of switching regulators, for example five switching regulators, i.e., five DC-DC converters 104 through 108, which receive a supply voltage from the positive power supply 123 of 3.3 V as an input. The DC-DC converters 104 through 106 supply voltages to the operational amplifier 119, and the DC-DC converters 107 and 108 supply voltages to a collector of the emitter follower 118. The supply voltage is converted by these DC-DC converter group 103 into a plurality of voltages whose values are stepwisely different. Specifically, the DC-DC converters 104 through 108 convert the positive voltage of 3.3V into voltages of 4.7 V, 3.2 V, 2.7 V, 1.8 V, and 1.3 V, respectively.

A conduction state and a cut-off state of the switch group 109 is controlled based on a driving signal outputted from the switch driver 116 according to slice data of the amplitude component which is sliced by the amplitude slicing means 102. Specifically, one path connected to the emitter follower 118 from the DC-DC converter group 103 and one path connected to the operational amplifier 119 therefrom are selectively conducted. A combination among the switches 110 through 115 which are simultaneously conducted is the switch 110 and the switch 112, the switch 111 and the switch 114, or the switch 113 and the switch 115.

The quadrature modulator 117 converts into an RF signal the phase component (Quadrature component and In-phase component) outputted from the phase amplitude separating means 101, and corresponds to a frequency converting means.

The emitter follower 118 performs a DC conversion of the amplitude component of the OFDM signal using as the power supply voltage the voltage from the positive power supply 123, or an output voltage from either of the switching regulators 107 and 108, which is selected by the switch group 109, and corresponds to a linear DC converting means. This emitter follower 118 is needed to drive a direct current when the amplitude component of the OFDM signal is provided to the RF power amplifier 124 as a supply voltage.

The operational amplifier 119 amplifies the amplitude component of the OFDM signal to a predetermined amplitude level so as to use it as a supply voltage of RF power amplifier 124. In this case, the operational amplifier 119 eliminates effects of a temperature characteristic, a distortion characteristic, or the like of the emitter follower by performing a negative feedback of an emitter output of the transistor composing the emitter follower 118. At this time, in order to guarantee the minimum value of the amplitude component, a negative voltage of, for example −2 V, is provided to the operational amplifier 119 from the negative power supply 122. In addition, as a positive voltage, either of the voltages of 4.7 V, 3.2 V, and 2.7 V which are outputted from the switching regulators 104 through 106 selected by the switch group 109 is inputted into the operational amplifier 119. Incidentally, the operational amplifier 119 corresponds to an amplitude amplifying means.

The saturated type RF power amplifier (PA) 124 receives the RF signal whose phase component is frequency-converted to an RF input terminal from the quadrature modulator 117, receives the amplitude component to which a DC conversion is performed to a power supply terminal from the emitter follower 118, and eventually outputs the modulated wave whose phase and amplitude are both modulated, namely whose amplitude and phase are multiplied.

Hereinafter, the operation will be explained. In this embodiment, a system having the supply voltage of 3.3 V is assumed.

The OFDM signal that is generated by the OFDM signal generating means 100 is separated into the amplitude component and the phase component by the phase amplitude separating means 101, and the amplitude component is provided to the operational amplifier 119. Consequently, the amplitude component which is amplified to a magnification level corresponding to a gain being set by the operational amplifier 119 is outputted to a base of the emitter follower 118 from the operational amplifier 119, and is then outputted from the emitter. At this time, a voltage which is shifted by Vbe=0.7 V in a positive direction from an emitter voltage of the emitter follower 118 appears at an output of the operational amplifier 119. Supposing an output dynamic range of the operational amplifier 119 is smaller than the supply voltage by 1 V, when modulating the RF power amplifier 124 between 0 to 3 V, the supply voltage to be supplied to the operational amplifier 119 is given by a voltage, +0.7 V (=Vbe)+1 V, which is provided to the RF power amplifier 124

In this embodiment, since a voltage of the RF power amplifier 124 is set at 3 V, 1.5 V, or 1.0 V, a voltage of 4.7 V, 3.2 V, and 2.7 V are provided to the operational amplifier 119 by the DC-DC converter 104, DC-DC converter 105, and the DC-DC converter 106, respectively. Incidentally, in this embodiment, since a non-inverting operational amplifier is used as the operational amplifier 119, the gain is determined by 1+R1/R2.

Based on the amplitude component provided to the emitter of the emitter follower 118, the amplitude slicing means 102 generates drive information for driving each of the switches 110 through 115 of the switch group 109 to ON/OFF state. Hereinafter, the drive information is called slice data.

A threshold range in which the amplitude component is included is detected by an amplitude slicing method. Specifically speaking, it is detected that a voltage amplitude level of the amplitude component exists which range of 0 to 1.0 V, 1.0 to 1.5 V, or 1.5 to 3.0 V, with respect to a predetermined plurality of thresholds 1.0 V, 1.5 V, and 3.0 V. The level is then rounded up to the maximum of the range in which it is included.

For example, if the amplitude component is given by $$0\ V < \text{amplitude component} \leq 1.0\ V$$

then it is rounded up to 1.0 V, $$1.0\ V < \text{amplitude component} \leq 1.5\ V$$

then it is rounded up to 1.5 V, and $$1.5\ V < \text{amplitude component} \leq 3.0\ V$$

then it is rounded up to 3.0 V.

Rounding is performed as follows. The DC-DC converters 107 and 108 are prepared so that voltages (1.3 V, 1.8 V) that are obtained by adding a collector-emitter saturation voltage Vcesat=0.3 V of the emitter follower 118 to a voltage level to be rounded may be outputted. With regard to a voltage of 3.0 V+0.3 V, since it is equal to the voltage of the positive power supply 123, none of the DC-DC converters is required. Voltages provided to the operational amplifier 119 are given by adding +1.7 V to the rounded voltages, resulting in the voltages of 2.7 V, 3.2 V, and 4.7 V.

According to the level of the amplitude component, the amplitude slicing means 102 provides information to the switch driver 116 which DC-DC converter (104 through 108) is activated, or whether the output of the positive power supply 123 is activated. According to the provided information, the switch driver 116 selectively turns on/turns off the switches 110 through 115 provided in output stages of the DC-DC converters 104 through 108 and the positive power supply 123, and outputs the voltage corresponding to the rounded voltage. Here, the switch 110 and the switch 112, the switch 111 and the switch 114, and the switch 113 and the switch 115 are driven by the same drive signal, respectively.

When explaining the embodiment, if the emitter output of the emitter follower 118 is 1.2 V, then paths of the DC-DC converter 107 and DC-DC converter 105 turn on. Consequently, the voltage of 1.8 V is provided to the collector of the emitter follower 118, and the voltage of 3.2 V is provided to a positive supply terminal of the operational amplifier 119. Similarly, when the amplitude component is 1.6 V, paths of the positive power supply 123 of 3.3 V and the DC-DC converter 104 turn on. Consequently, the voltage of 3.3 V is provided to the collector of the emitter follower 118, and the voltage of 4.7 V is provided to the positive supply terminal of the operational amplifier 119.

The amplitude component outputted from the phase amplitude separating means 101 is inputted into a noninverting (+) input terminal of the operational amplifier 119, amplified by the gain 1+R1/R 2 which is determined by the resistor 120 with the resistance R1 and the resistor 121 with the resistance R2, and inputted into the base of the emitter follower 118. The amplitude component outputted from the emitter of the emitter follower 118 is then supplied to a drain/collector power supply terminal of the RF power amplifier 124.

Preferably, the amplitude component is outputted in synchronization with the slice data.

At this time, when the amplitude component is not synchronized with the slice data, a needlessly large voltage drop will appear, so that a power supply loss will be increased.

By achieving such operation, a voltage drop of the emitter follower 118, that is, a potential difference between a collector terminal of the emitter follower and a emitter terminal of the emitter follower is kept at a small value, so that the power supply loss of the emitter follower 118 is suppressed to be low. Moreover, by providing the minimum positive supply voltage to the operational amplifier 119 within a dynamic range, a useless power loss in an output stage of the operational amplifier 119 can be suppressed to be low, so that the power supply loss in the operational amplifier 119 can be suppressed to be low, thereby making it possible to achieve an improvement in efficiency of the whole transmitter.

Meanwhile, since the phase component needs to be frequency-converted to the modulated wave, it is inputted into the quadrature modulator 117 as I (In-phase) signal and Q (Quadrature) signal, and is multiplied by a carrier.

In the RF power amplifier 124, the amplitude component outputted from the emitter follower 118 is inputted into the power supply terminal, and the phase component outputted from the quadrature modulator 117, that is, the modulated wave, is inputted into an RF signal input terminal. Consequently, at the output of the RF power amplifier 124, a result of multiplying the phase component by the amplitude component is outputted, so that a correct OFDM modulated wave is obtained.

Preferably, the amplitude component and the phase component are not shifted in timing when multiplied in the RF power amplifier 124.

Hereinafter, an expected effect according to the operation described above will be explained.

Supposing that the power efficiency of the DC-DC converters 104 through 108 is 96%, and there is no voltage drop in the switches 110 through 115. In addition, it is assumed that the efficiency of the saturated type RF power amplifier 124 is 80%.

In the wireless LAN IEEE802.11a standard, supposing that an average output power is, for example 13 dBm (20 mW), since a peak power value is given by adding 7 dB to the average output power, a resultant value will be 20 dBm (100 mW). Therefore, the RF power amplifier 124 needs to output the peak power of 20 dBm. Supposing that a power efficiency (RF output power/applied DC power) of the RF power amplifier 124 is 80%, a resultant DC power PDC will be 125 mW when an AC power PAC has the peak power of 100 mW (20 dBm). At this time, supposing that the supply voltage is 3 V, a current of 41.7 mA is required at the peak period. The supply voltage (average voltage) required for the RF power amplifier 124 is 1.3 V during the average power, and the DC power PDC will be 25 mW with respect to the average output power of 20 mW (13 dBm) of the AC power PAC, so that a current of 19.2 mA is required.

Hereinafter, an efficiency during the average power, i.e., the output of 20 mW, will be is discussed.

A power loss of the power supply means will be discussed. Since the average voltage is 1.3 V, under the condition that DC-DC converter 107 that outputs the voltage of 1.8 V is selected, the average voltage drop in the emitter follower 118 can be assumed to be 0.5 V. Since it is further assumed that there is no voltage drop in each of the switches 110 through 115 which compose the switch group 109, the power supply loss in the switch group 109 and the emitter follower 118 is calculated as 19.2 mA×0.5 V=9.6 mW.

In addition, since a power supply loss of the DC-DC converters 104 through 108 is 4%, a power supply loss in the DC-DC converters 107 and 108 will be given by 25 mW×0.04=1.0 mW.

It is further assumed that a consumed electric current of the operational amplifier 119 is 10 mA in the negative power supply 122, and a current supplied to the DC-DC converters 104 through 106 is 20 mA. Then, since the DC-DC converter of 3.2 V is selected as a result of 1.3+1.7 V of the average voltage, power consumption of the positive power supply 123 will be given by 3.2 V×20 mA=64 mW.

Meanwhile, that of the negative power supply 122 will be given by

|−2 V|×10 mA=20 mW.

so that power consumption in the operational amplifier is 84 mW in total.

In addition, the power supply loss of the DC-DC converters 104 through 106 used as the power supply of the operational amplifier 119 will be given by 64 mW×0.04=2.6 mW.

Therefore, a total power supply loss of the switch group 109, the emitter follower 118, and the DC-DC converter group 103 will be given by 9.6 mW+1.0 mW+84 mW+2.6 mW=97.2 mW. Consequently, a total efficiency during the average power will be given by 20 mW/97.2 mW=21%.

That makes it possible to achieve a significant improvement in efficiency, as compared with obtaining an efficiency of only at most 10% when using the normal linear amplifier.

Further, a DC converting means that has conventionally modulated a gate of a MOS transistor for switch inside a DC-DC converter is changed into a configuration of the DC-DC converters 107 and 108 and the emitter follower 118 which output a constant voltage, thereby making it possible to achieve broadband of the EER method which has been difficult by the DC-DC converter itself. The reason is as follows.

That is, a low pass filter or a switching element which restricts a band does not exist in the emitter follower 118. Therefore, the band of the EER method is only restricted by other factors, for example, a cut-off frequency of the emitter follower 118, or a band determined by a phase delay or the like due to a feedback loop.

These restriction elements far exceed a signal band of 1 MHz which can be outputted by a former switching regulator, and can fully cover a band of the amplitude component which reaches 40 MHz of the OFDM signal of the wireless LAN.

Further, a band restriction filter may be provided at the output of the RF power amplifier 124.

Still further, the DC-DC converters 104 through 108 may refer to DC-DC converters which also include low pass filters at the outputs. In this configuration, there may be provided a low pass filter that suppresses a spurious outside the modulated wave band between the output of the emitter follower 118 and the power supply terminal of the RF power amplifier 124.

Incidentally, in the above explanation, it has been explained that the amplitude component has been preferably synchronized with the amplitude slice data. However, it will be insignificant as long as an output voltage of the operational amplifier 119 or an output voltage of the DC-DC converter has been adjusted so that an output voltage of the emitter follower 118 may not exceed a voltage obtained by deducting the saturation voltage of the emitter follower 118 from the output voltages of the DC-DC converters 107 and 108, and so that a difference between the output voltages of the DC-DC converters 104 through 106 and the output voltage of the operational amplifier 119 may be a voltage difference which the operational amplifier 119 requires in order for the output voltage not to be distorted in the operational amplifier 119. In addition, for example, a time margin may be given to the slice data in advance so that the above-mentioned state may not occur even when there is a timing shift to a certain extent.

Further, although it has been explained that the component inputted as the RF power and the component inputted as the supply voltage have been preferably inputted in synchronization with the RF power amplifier 124, an Error Vector Magnitude of a transmission output is increased when the timing is shifted, so that a radio standard may not be satisfied. Accordingly, it is required to synchronize the timing as much as possible by applying following methods.

A first method is to perform a timing adjustment only in manufacturing. This method does not need to provide a feedback circuit or the like in a radio circuit, thereby making it possible to achieve the simplification. However, the synchronization may be unable to be taken depending on an operating environment.

A second method is to perform the timing adjustment only when the power supply is in ON-state. According to this method, it can deal with an environment where the power supply is in ON-state, and the synchronization can be taken more certainly than that of the first method. However, there is a problem that communication can not be performed by the time that a calibration takes.

Further, a third method is a method which is effective when there is performed a TDD (time division multiplex) in which a transmission and a reception are alternately repeated, such as, for example wireless LAN. In other words, the third method is a method of performing the timing adjustment using a switching time between the transmission and the reception in such wireless communications. This can be successively adapted to environments and is the most ideal, but needs to complete the calibration within the switching time between the transmission and the reception specified by the radio standard. In the wireless LAN, since the switching time between the transmission and the reception is equal to or less than 1 microsecond, an idea for completing the calibration within such a short time is required.

Further, as a fourth method, there is a method that, while turning on the receiver even during the transmission, the transmission wave which wraparounds a receiving means from an antenna switch is received and demodulated, so that the timing between the amplitude component and the phase component is compensated so that the amount of bit errors of the demodulated signal may become the minimum. According to this method, since a large power is inputted into the receiving means when the isolation of the antenna switch is not sufficient, it is necessary to increase linearity of the receiving means.

In addition, a combination thereof may also be considered.

Incidentally, in this embodiment, a direct conversion manner that directly up-converts a baseband IQ signal to the RF signal is used as a modulation circuit. As means of generating the phase component, other than a method of converting the baseband IQ signal to the RF signal by a frequency converter like the direct conversion manner, there may be used a VCO modulation scheme which directly modulates the baseband signal by combining, depending on a signal obtained by wave-shaping the baseband signal, voltage variable capacity portions of a voltage controlled oscillator used as a local oscillation signal source, for example varactor diodes or fixed capacitors having multiple capacitance values, by a MOS transistor switch, and changing a capacitance for achieving variable capacity or the like.

According to the VCO modulation scheme, a circuit configuration becomes simple, so that a reduction in consumed electric current can be achieved, but it is not suitable when strict accuracy is required. Further, there is also a manner which does not directly up-convert the IQ signal to the RF signal, but up-converts it to the RF signal via an IF signal. According to this manner, since a frequency of the local oscillation signal source and that of the transmission wave are different, a problem that the local oscillation signal source is swung by the transmission wave can be avoided. However, it is disadvantageous with regards to the consumed electric current or the spurious.

As described above, according to this embodiment, there is employed a configuration that the plurality of DC-DC converters 104 through 108 which converts the supply voltage into the plurality of voltages having values stepwisely different are provided, either of the DC-DC converters is selected according to the levels of the amplitude component, and the emitter follower 118 and the operational amplifier 119 are operated using the output voltage of the selected DC-DC converter as the supply voltage. Therefore, the voltage drop due to the emitter follower 118 when performing the DC conversion can be suppressed to be low, so that a reduction in power consumption of the emitter follower 118 can be achieved, and the power consumption of the operational amplifier 119 can also be suppressed to be low. In addition, it is possible to achieve broadband by using the emitter follower 118 for the DC conversion. Accordingly, the broadband EER method can be achieved, without reducing the efficiency.

In addition, the temperature characteristic and the distortion of the emitter follower 118 can be cancelled with the negative feedback to the operational amplifier 119.

In addition, since the quadrature modulator 117 which is the frequency converting means is provided between the output terminal of the phase component of the phase amplitude separating means 101 and the input terminal of the RF power amplifier 124, following effects may be obtained. Since a band of the phase amplitude separating means 101 is determined by a band of an internal DA converter and is hundreds of MHz at most, it is widely different from, for example a frequency of 5.15 to 5.35 GHz which is a standard frequency of 802.11a. The standard frequency can easily be achieved by a frequency-conversion to the carrier in the quadrature modulator 117.

In this embodiment, the emitter follower is used as the linear DC converting means, but a common emitter amplifier composed of a PNP transistor may be used as the linear DC converting means. By changing the emitter follower to the common emitter amplifier, the gain of the operational amplifier can be reduced, so that a GB (gain-bandwidth) product requirement for the operational amplifier can be relaxed.

Further, not a bipolar transistor but a MOS transistor may be used for a linear conversion means. In the bipolar transistor, when a collector-emitter voltage becomes a saturation voltage or less, a diode current will flow between a base and an emitter, and a load of the operational amplifier becomes heavy suddenly, so that an abnormal oscillation is induced, but in the MOS transistor, even when a drain-source voltage becomes a saturation voltage or less, an input impedance of the MOS transistor does not change largely, so that the operational amplifier operates stably.

Further, the OFDM signal generating means 100 may includes a distortion compensating means that compensates a distortion of a transmission path. Particularly, since a saturation amplifier is used as the RF power amplifier 124, the phase and the amplitude have large nonlinearity to the supply voltage. Therefore, requirements of modulation accuracy or a spectrum mask may not be satisfied without any modification. By performing an operation of an inverse function of a nonlinear characteristic to an original OFDM signal in the OFDM signal generating means 100, a modulated wave without any distortion will be obtained at the output of the RF power amplifier 124.

(Second Embodiment)

Figure 2:
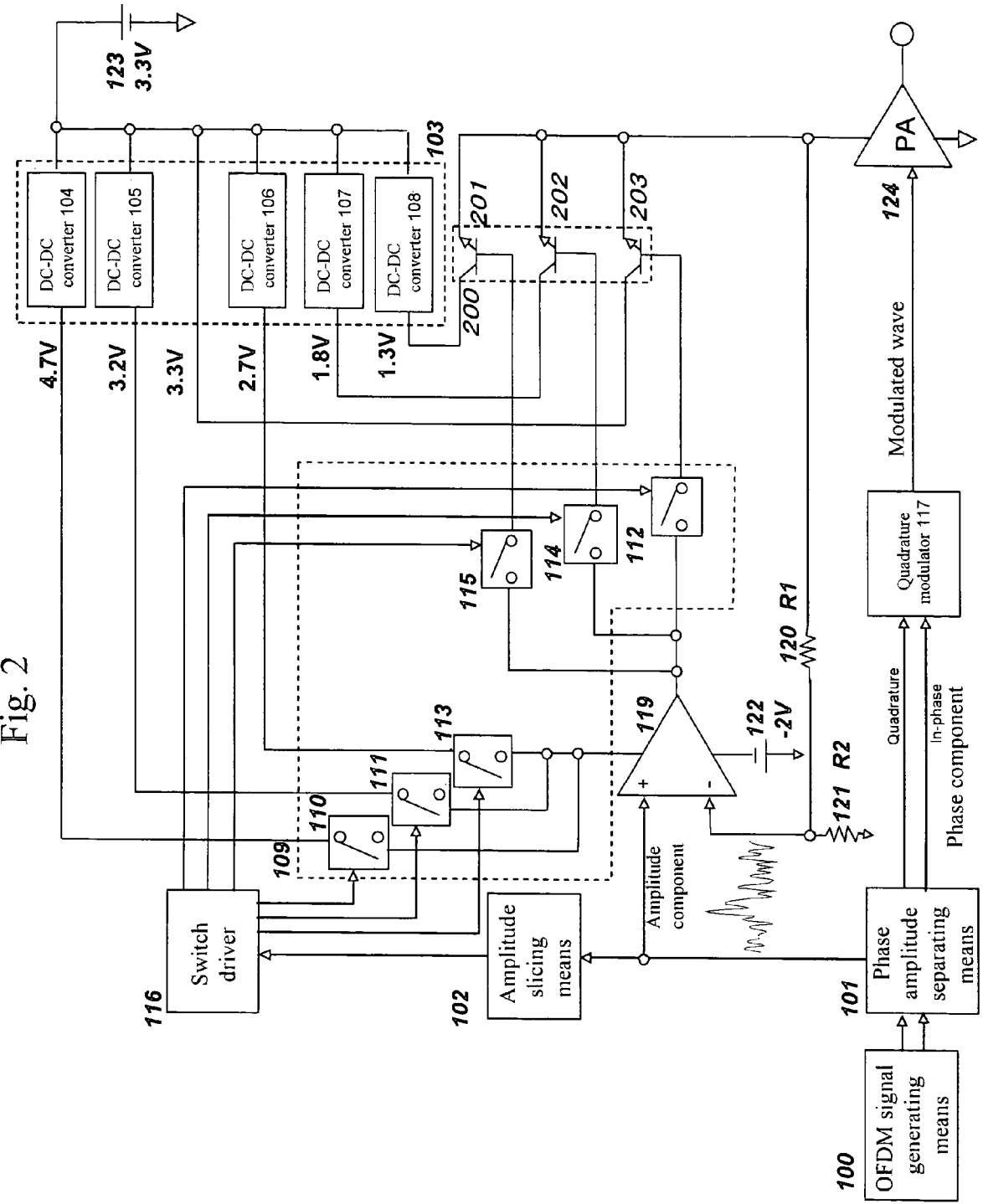
FIG. 2 is a block diagram showing a configuration of a transmitter according to a second embodiment of the present invention.

FIG. 2 is a block diagram of a transmitter according to a second embodiment of the present invention. This embodiment is different from the first embodiment with respect to the followings. That is, the outputs from the positive power supply 123 and the DC-DC converters 107 and 108 are directly connected the collectors of respective emitter followers 201 through 203 of an emitter follower group 200 of the same number as that of those outputs. In addition, paths connected to base terminals of respective emitter followers 201 through 203 of this emitter follower group 200 are switched by switches the 112, 114, and 115, the number of which is the same as that of the emitter followers 201 through 203 of the emitter follower group 200. The same symbol is given to the same component as that of the first embodiment and description thereof will be omitted.

A base current of the specific emitter follower among the emitter followers 201 through 203 of the emitter follower group 200 is selectively made to flow by the switched 112, 114, and 115, so that it is selected which current among the currents of the positive power supply 123 and the DC-DC converters 107 and 108 is to be supplied to the RF power amplifier 124. Incidentally, the emitter follower group 200 corresponds to the linear DC converting means. Preferably, the switches 112, 114, and 115 are composed of NMOS transistors.

As for additional effects expected for the second embodiment, since the emitter follower group 200 is only provided between the DC-DC converters 107 and 108 and the RF power amplifier 124, and the switch group 109 is removed from a power supply path, that is, a path from the power supply to the RF power amplifier 124, the power loss can further be reduced as compared with the configuration of the first embodiment.

(Third Embodiment)

Figure 3:
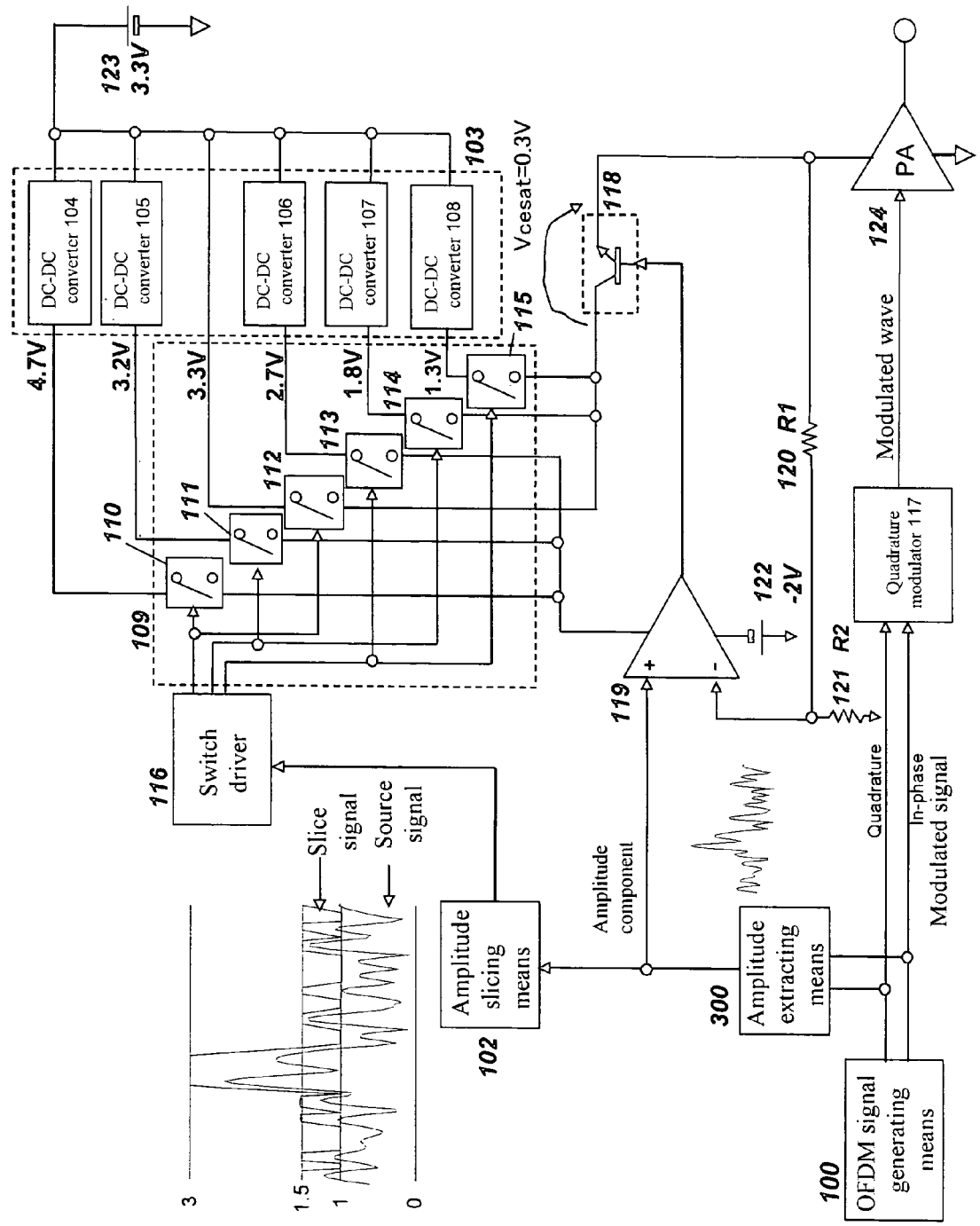
FIG. 3 is a block diagram showing a configuration of a transmitter according to a third embodiment of the present invention.

FIG. 3 is a block diagram of a transmitter according to a third embodiment of the present invention. This embodiment is different from the first embodiment with respect to the followings. That is, an output of the OFDM signal generating means 100 is outputted to the quadrature modulator 117. The output of the OFDM signal generating means 100 is also inputted into an amplitude extracting means 300. The amplitude component extracted by the amplitude extracting means 300 is outputted to the operational amplifier 119 and the amplitude slicing means 102. The same symbol is given to the same component as that of the first embodiment and description thereof will be omitted.

As for additional effects expected for the third embodiment, since not the phase component but the modulated signal is provided to the RF power amplifier 124 via the quadrature modulator 117 as it is, it is possible to avoid the deterioration of the modulation accuracy (Error Vector Magnitude: EVM), which can not be avoided in the EER method of separating the signal into the amplitude component and the phase component.

That is, when using the phase component, the phase component is filtered within the range that a band of an digital-to-analog converter allows, and to the extent of not affecting the EVM. However, a partial amplitude drop of the phase component produced by the filtering has caused a remarkable deterioration of the EVM, when the phase component has been composed with the amplitude component in an output portion of the RF power amplifier.

In addition, since as compared with the phase component separated from the modulated signal, a necessary bandwidth of the modulated signal is smaller by about ⅙, a bandwidth of a digital-to-analog converter and a bandwidth of an anti-aliasing filter which suppresses a spurious component produced by digital-to-analog conversion can be narrowed. Therefore, it is advantageous to a reduction in power consumption of the digital-to-analog converter, and a reduction in cost of a circuit following it.

In addition, according to the conventional EER method, since the modulated wave has been injected at an input level that has made the RF power amplifier sufficiently saturate even when the peak power has been inputted, if an isolation characteristic when the RF power amplifier has been in OFF-state (the amplitude component is 0) has not been good, a multiplication with the amplitude component has not been performed correctly, so that an original modulated wave has not been able to be restored (deterioration of EVM performance has been caused). According to this configuration, since when the RF power amplifier is in OFF-state (the amplitude component is 0), the power inputted into the RF power amplifier is also 0, a correct modulated wave can be restored without depending on the isolation characteristic.

Although the modulated signal is converted into the modulated wave using the quadrature modulator 117 in this configuration, the quadrature modulator 117 can be eliminated when the OFDM signal generating means 100 outputs the modulated wave. In this case, the amplitude extracting means 300 detects the amplitude of the modulated wave to extract the amplitude component.

(Fourth Embodiment)

Figure 4:
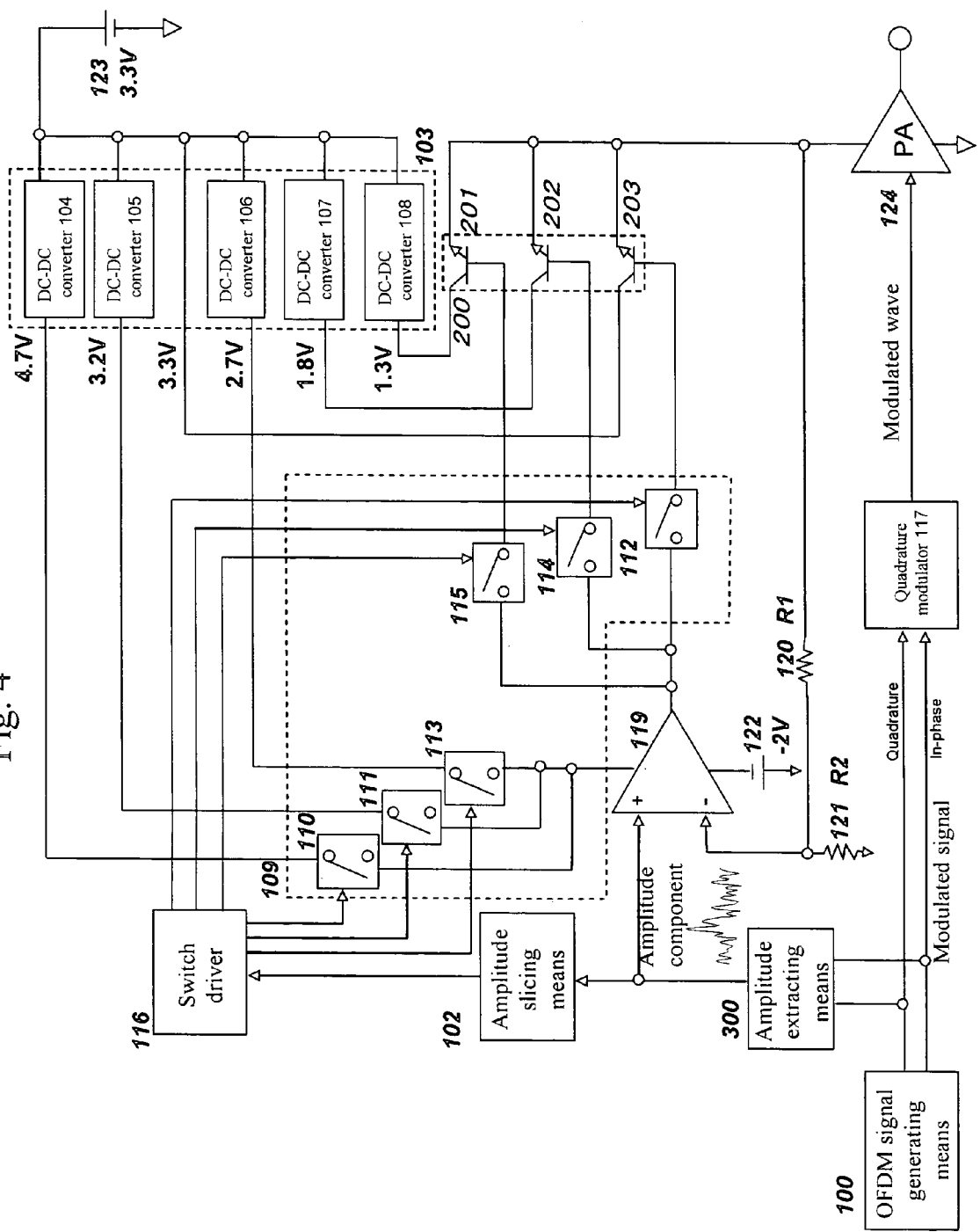
FIG. 4 is a block diagram showing a configuration of a transmitter according to a fourth embodiment of the present invention.
Figure 5:
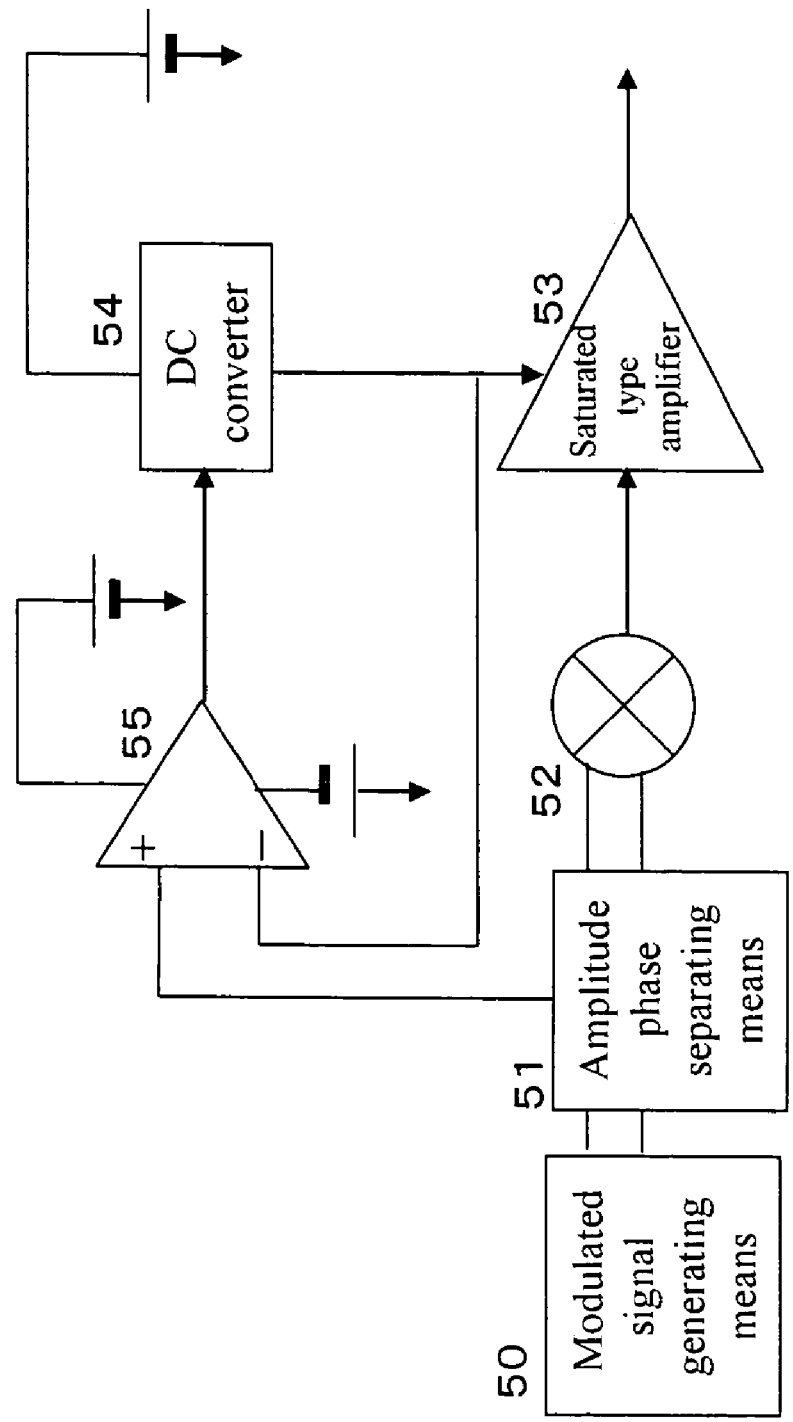
FIG. 5 is a block diagram showing a configuration of a conventional transmitter.

FIG. 4 is a block diagram of a transmitter according to a fourth embodiment of the present invention. This embodiment is different from the third embodiment with respect to the followings. That is, the outputs from the positive power supply 123 and the DC-DC converters 107 and 108 are directly connected to the collectors of the emitter follower group 200 of the same number as that of the outputs. In addition, the paths connected to the base terminals of this emitter follower group 200 are switched by the switches 112, 114, and 115 of the same number as that of the emitter follower group 200. The same symbol is given to the same component as that of the first and the third embodiments and description thereof will be omitted. Incidentally, the emitter follower group 200 corresponds to the linear DC converting means. Preferably, the switches 112, 114, and 115 are composed of NMOS transistors.

As for additional effects expected for the fourth embodiment, since the emitter follower group 200 is only provided between the DC-DC converters 107 and 108 and the positive power supply 123, and the RF power amplifier 124, and the switches 112, 114, and 115 are removed from the power supply path, that is, the path from the power supply to the RF power amplifier 124, the power loss can further be reduced as compared with the configuration of the third embodiment.

INDUSTRIAL AVAILABILITY

The transmitter according to the present invention provides an effect of allowing broadband and highly efficient operation in the EER method that can operate the RF power amplifier as a saturated type, and is useful as a transmitter or the like of a communication mode using a multicarrier signal, such as an OFDM (Orthogonal Frequency Division Multiplex) scheme.

What is claimed is:

1. A signal transmitter, comprising:
   a modulated signal generating means that generates a modulated signal;
   an amplitude slicing means that slices an amplitude component of said modulated signal at a plurality of voltage levels which are stepwisely different;
   a first and a second plurality of switching regulators that convert a supply voltage into a plurality of voltages whose values are stepwisely different;
   a first switch group that selects any one of output voltages of said first plurality of switching regulators;
   a second switch group that selects any one of output voltages of said second plurality of switching regulators;
   a switch driver that selectively makes a conduction of each of switches of said first and said second switch group according to slice data of the amplitude component sliced by said amplitude slicing means;
   an amplitude amplifying means that amplifies said amplitude component using an output voltage of either of said switching regulators selected by said first switch group as a supply voltage;
   a linear DC converting means that performs a DC-conversion of an output from said amplitude amplifying means using an output voltage of either of said switching regulators selected by said second switch group as a supply voltage; and
   an RF power amplifier that receives said modulated signal or its phase component to an RF input terminal, receives an amplitude component to which the DC-conversion is performed by said linear DC converting means to a power supply terminal, and eventually outputs a modulated wave.

2. The transmitter according to claim 1, wherein said first switch group is provided between output terminals of said first plurality of switching regulators and a power supply terminal of said amplitude amplifying means, and said second switch group is provided between output terminals of said second plurality of switching regulators and a power supply terminal of said linear DC converting means.

3. The transmitter according to claim 1, wherein said first switch group is arranged between output terminals of said first plurality of switching regulators and a power supply terminal of said amplitude amplifying means,
   said plurality of linear DC converting means are arranged corresponding to said second plurality of switching regulators, respectively, the output terminals of said second plurality of switching regulators are individually connected to power supply terminals of said plurality of linear DC converting means, respectively, and the output terminal of said plurality of linear DC converting means are connected to a power supply terminal of said RF power amplifier in common, and
   said second switch group is arranged between an output terminal of said amplitude amplifying means and input terminals of said plurality of linear DC converting means.

4. The transmitter according to claim 1, comprising a frequency converting means in a preceding stage of said RF power amplifier.

* * * * *